United States Patent
Fitzgerald

(10) Patent No.: US 6,778,108 B2
(45) Date of Patent: Aug. 17, 2004

(54) METHOD AND APPARATUS FOR COMPRESSION OF BINARY DATA

(75) Inventor: Shane Michael Fitzgerald, Long Beach, CA (US)

(73) Assignee: IPMobileNet, Inc., Irvine, CA (US)

( * ) Notice: Subject to any disclaimer, the term of this patent is extended or adjusted under 35 U.S.C. 154(b) by 7 days.

(21) Appl. No.: 10/193,010

(22) Filed: Jul. 9, 2002

(65) Prior Publication Data

US 2004/0008131 A1 Jan. 15, 2004

(51) Int. Cl.[7] ............................................. H03M 7/12
(52) U.S. Cl. .......................... 341/71; 714/709; 714/810
(58) Field of Search ............................ 341/71; 714/810, 714/709; 348/244; 398/199; 332/108; 375/240.27

(56) References Cited

U.S. PATENT DOCUMENTS

| | | | | |
|---|---|---|---|---|
| 3,601,702 A | * | 8/1971 | Lender ........................ | 714/810 |
| 4,665,427 A | * | 5/1987 | Beckley et al. ............. | 348/441 |
| 4,794,461 A | * | 12/1988 | Roberts et al. ............. | 382/244 |
| 5,105,294 A | * | 4/1992 | Degura et al. .............. | 398/199 |
| 5,170,396 A | * | 12/1992 | Rivers et al. ................ | 714/709 |
| 6,025,888 A | * | 2/2000 | Pauls ...................... | 375/240.27 |
| 6,359,525 B1 | * | 3/2002 | Mohan et al. .............. | 332/108 |

FOREIGN PATENT DOCUMENTS

EP       1 278318 A2  *  1/2003

* cited by examiner

*Primary Examiner*—Jean Bruner Jeanglaude
(74) *Attorney, Agent, or Firm*—J. D. Harriman, Esq.; Coudert Brothers LLP

(57) ABSTRACT

The invention is a method and apparatus for compression of binary data. The signal is used before modulation to increase the effective transmission rate by compressing it prior to being encoded onto a magnetic tape or other storage media. The transition bits of the data have a bit period no smaller than the smallest bit period without increasing the maximum frequency. However, non-transition bits have a bit period smaller than that of the transitioning bits. Since there is at least one full bit period between any two transitions, the maximum frequency is unaffected and is used for synchronization. Noise in a transmission is masked using bit period information, and since no other transition can be valid until at least the transition bit period has passed, noise occurring before passage of the transition bit period does not result in an error.

60 Claims, 10 Drawing Sheets

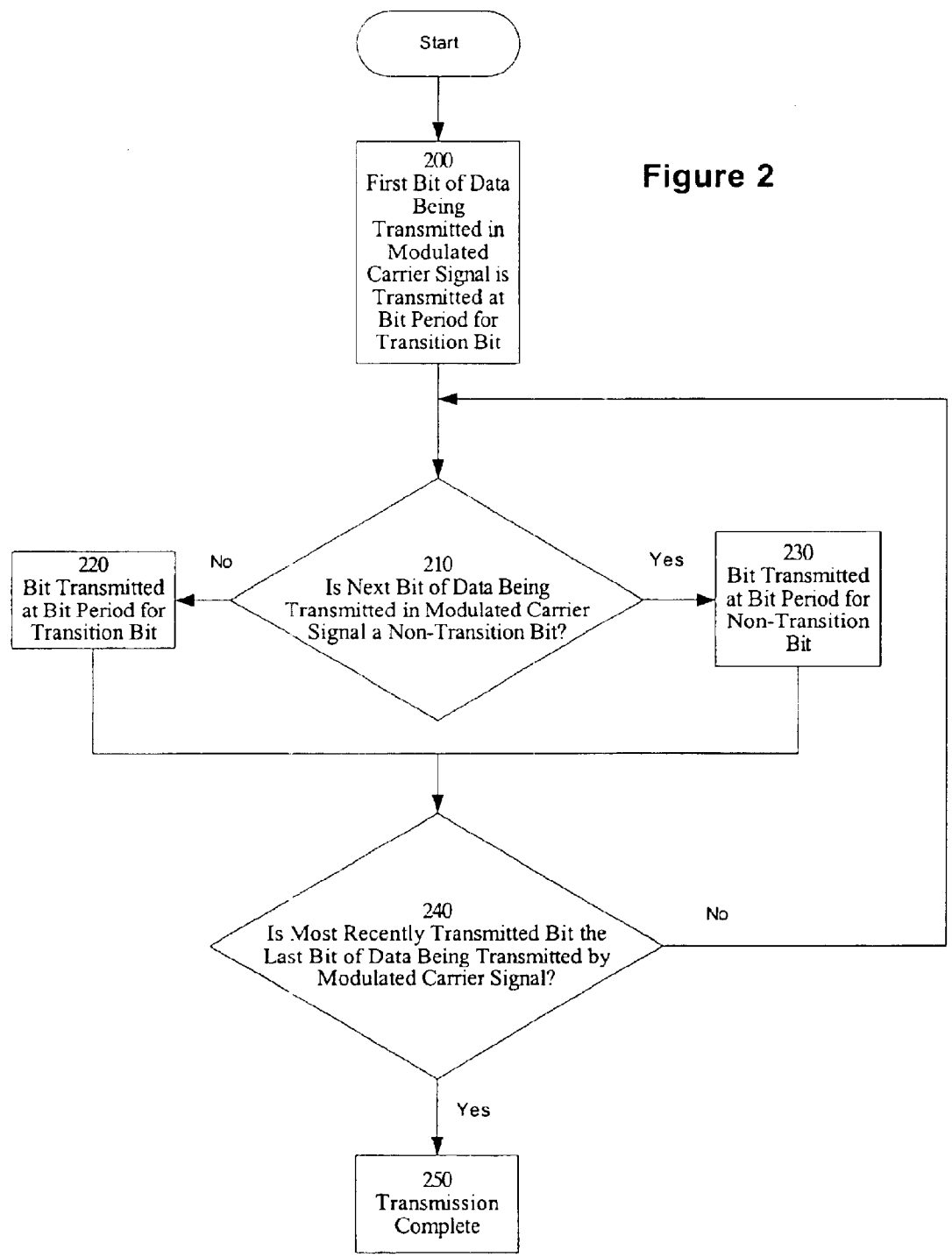

METHOD AND APPARATUS FOR COMPRESSION OF BINARY DATA

BACKGROUND OF THE INVENTION

1. Field of the Invention

The present invention relates to the field of data compression, and in particular to a method and apparatus for compression of binary data prior to transmission or storage.

2. Background Art

Frequently, it is necessary or desirable to transmit data from one location to another using some form of modulation or to store information on storage media using some encoding algorithm. For example, a text document may be encoded and transmitted between two computers using frequency modulation (FM). Another example is the storage of binary data on a tape drive storage device. It is generally desirable to transmit or store data efficiently, but prior transmission methods are not as efficient as is possible. These limitations can be better understood with a review of modulated transmissions.

Modulated Transmissions

Modulation is the addition of information to an electronic, optical or other signal carrier. Modulation can be applied to direct current, to alternating current, and to optical signals (e.g., laser light, or radio or magnetic waves).

For most of radio and telecommunication today, the carrier is alternating current in a given range of frequencies, and common modulation methods include:

Amplitude modulation (AM), in which the amplitude of the transmitted signal is varied over time;

Frequency modulation (FM), in which the frequency of the carrier signal is varied in small but meaningful amounts; and Phase modulation (PM), in which the natural flow of the alternating current waveform is delayed temporarily.

These are sometimes known as continuous wave modulation methods to distinguish them from pulse code modulation, which is used to encode both digital and analog information in a binary way. Radio and television broadcast stations typically use AM or FM, and most two-way radios use FM.

Increasing Effective Transmission Rates

The transmission rate is the number of information units transmitted per time unit. For example, a network connection may transmit at a Gigabit per second. It is possible to increase the effective transmission rate without increasing the transmission rate. For example, one method of increasing effective transmission rates is to compress the data before it is encoded in the modulated transmission. Since fewer bits are being transmitted, the effective transmission rate is increased.

For example, if a 100 megabyte data file is transmitted at 1 megabyte per second, the entire process will take 100 seconds. However, if the data file is first compressed into a 60 megabyte file, the transmission will require only 60 seconds. While this method can increase effective transmission rates, it is limited by the amount the data file can be compressed before being modulated.

Another method of increasing effective transmission rates is to simply increase the transmission rate. For example, if each bit took 2 seconds to transmit and the rate was increased to transmitting each bit in 1 second, the transmission rate would double. However, this method also increases the maximum frequency of the signal. For example, a modulated carrier signal that had a maximum frequency of 10 MHz would now have a maximum frequency of 20 MHz. Thus, this method cannot be used when the maximum frequency is near some threshold value imposed either by physical limitations (e.g., bandwidth) or protocols of the transmission system.

SUMMARY OF THE INVENTION

Embodiments of the present invention are directed to a method and apparatus for compression of binary data. In one embodiment of the present invention, a modulated signal is compressed. In one embodiment, compression of the modulated signal is used in addition to compression of the data before modulation to increase the effective transmission rate. In other embodiments, binary data is compressed prior to being encoded onto magnetic tape or other storage media.

In one embodiment, data is transmitted using an FM signal. The FM signal is compressed without increasing the maximum frequency. In one embodiment, transition bits (e.g., a 1 following a 0, or a 0 following a 1) have a bit period (i.e., the time between successive bits) no smaller than the smallest bit period possible without increasing the maximum frequency. However, non-transition bits (e.g., a 0 following a 0, or a 1 following a 1) have a bit period smaller than that of the transitioning bits. For example, in one embodiment, the bit period of non-transition bits is one-half that of the bit period for transition bits. Thus, a sequence of a transition bit followed by two non-transition bits (e.g., 111 or 000) would be transmitted in two bit periods instead of three.

The maximum frequency is determined by the space between the two transitions that occur most closely together (e.g., 0 to 1 to 0, or 1 to 0 to 1). Since there is still guaranteed to be at least one full bit period between any two transitions, the maximum frequency is unaffected. Thus, the maximum frequency is used, in one embodiment, for synchronization purposes.

In one embodiment, a header sequence is transmitted. In one embodiment, the header sequence is known to the receiving system. Thus, the header sequence is used to synchronize the receiving system. In one embodiment, the header sequence contains a series of transition bits (e.g., 1010 or 0101) to assist in synchronization. In another embodiment, every time a transition bit is received, synchronization is performed. In yet another embodiment, the header contains a non-transition bit (e.g., 10100 or 01011). Because the receiving system knows where the non-transition bit occurs, the system is able to determine the bit period of non-transition bits. Thus, the system is capable of receiving different transitions that each have a different bit period for non-transition bits (e.g., one with a bit period equal to one-half the length of the bit period for transition bits, and another with a bit period equal to one-fifth the length of the bit period for transition bits).

In another embodiment, noise in a transmission is masked using bit period information. When a transition bit occurs, no other transition can be valid until at least the transition bit period has passed. Thus, noise occurring before passage of the transition bit period will not result in an error. This noise immunity property increases as the percentage of transition bits in the data increases.

BRIEF DESCRIPTION OF THE DRAWINGS

These and other features, aspects and advantages of the present invention will become better understood with regard to the following description, appended claims and accompanying drawings where:

FIG. 2 is a flow diagram of the process of compressing a modulated carrier signal in accordance with one embodiment of the present invention.

DETAILED DESCRIPTION OF THE INVENTION

The invention is a method and apparatus for compression of modulated data transmission. In the following description, numerous specific details are set forth to provide a more thorough description of embodiments of the invention. It is apparent, however, to one skilled in the art, that the invention may be practiced without these specific details. In other instances, well known features have not been described in detail so as not to obscure the invention.

Embodiments of the present invention are directed to a method and apparatus for compression of modulated data transmission. In one embodiment of the present invention, the modulated signal is compressed. In one embodiment, compression of the modulated signal is used in addition to compression of the data before modulation to increase the effective transmission rate.

Figure 1:
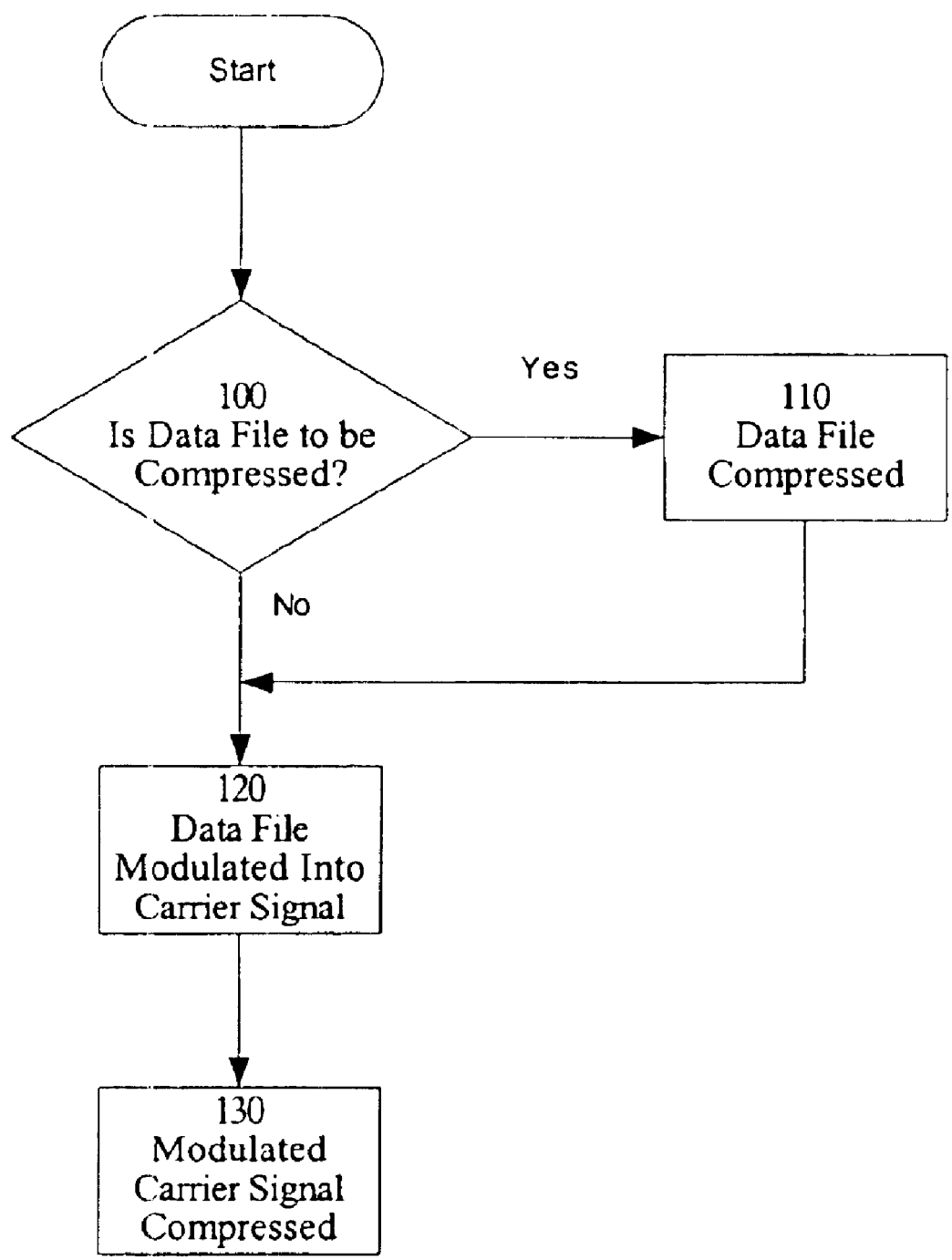
FIG. 1 is a flow diagram of the process of transmitting data in accordance with one embodiment of the present invention.

FIG. 1 illustrates the process of transmitting data in accordance with one embodiment of the present invention. At block 100, it is determined whether the data file is to be compressed. If the data file is to be compressed, at block 110, the data file is compressed and the process continues at block 120. If the data file is not to be compressed, at block 120, the data file is modulated into a carrier signal. At block 130, the modulated carrier signal is compressed.

Compression of a Modulated Carrier Signal

In one embodiment, data is transmitted using an FM signal. The FM signal is compressed without increasing the maximum frequency. In one embodiment, transition bits (e.g., a 1 following a 0, or a 0 following a 1) have a bit period (i.e., the time between successive bits) no smaller than the smallest bit period possible without increasing the maximum frequency. However, non-transition bits (e.g., a 0 following a 0, or a 1 following a 1) have a bit period smaller than that of the transitioning bits. For example, in one embodiment, the bit period of non-transition bits is one-half that of the bit period for transition bits. Thus, a sequence of a transition bit followed by two non-transition bits (e.g., 000 or 111) would be transmitted in two bit periods instead of three.

FIG. 2 illustrates the process of compressing a modulated carrier signal in accordance with one embodiment of the present invention. At block 200, the first bit of data being transmitted in the modulated carrier signal is transmitted at the bit period for a transition bit. In one embodiment, the bit period for the transition bit is the smallest possible bit period that doesn't increase the maximum frequency beyond a limiting threshold. At block 210, it is determined whether the next bit of data being transmitted in the modulated carrier signal is a non-transition bit. If the next bit of data being transmitted in the modulated carrier signal is not a non-transition bit, at block 220, it is transmitted at the bit period for a transition bit and the process continues at block 240.

If the next bit of data being transmitted in the modulated carrier signal is a non-transition bit, at block 230, it is transmitted at the bit period for a non-transition bit and the process continues at block 240. In one embodiment, the bit period for a non-transition bit is the smallest possible fraction of the bit period for a transition bit without losing or corrupting the data being transmitted. In another embodiment, the non-transition bit period is not the smallest possible fraction of the transition bit period, but it is still smaller than the transition bit period.

In one embodiment, the non-transition bit period is one-half of the transition bit period. In other embodiments, the non-transition bit period could be one-third of the transition bit period, one-fourth of the transition bit period, one-fifth of the transition bit period, or still smaller ratios of non-transition bit period to transition bit period.

At block 240, it is determined whether the most recently transmitted bit was the last bit of data being transmitted by the modulated carrier signal. If the most recently transmitted bit was the last bit of data being transmitted by the modulated carrier signal, at block 250, the transmission is complete. If the most recently transmitted bit was not the last bit of data being transmitted by the modulated carrier signal, the process repeats at block 210.

The maximum frequency is determined by the space between the two transitions that occur most closely together (e.g., 0 to 1 to 0, or 1 to 0 to 1). Since there is still guaranteed to be at least one full bit period between any two transitions, the maximum frequency is unaffected.

In other embodiments, the above scheme is used to compress binary data regardless of whether the binary data is being transmitted. For example, one embodiment uses the above scheme to compress binary data that is stored on a magnetic tape.

Decompression of a Modulated Carrier Signal

Figure 3A:
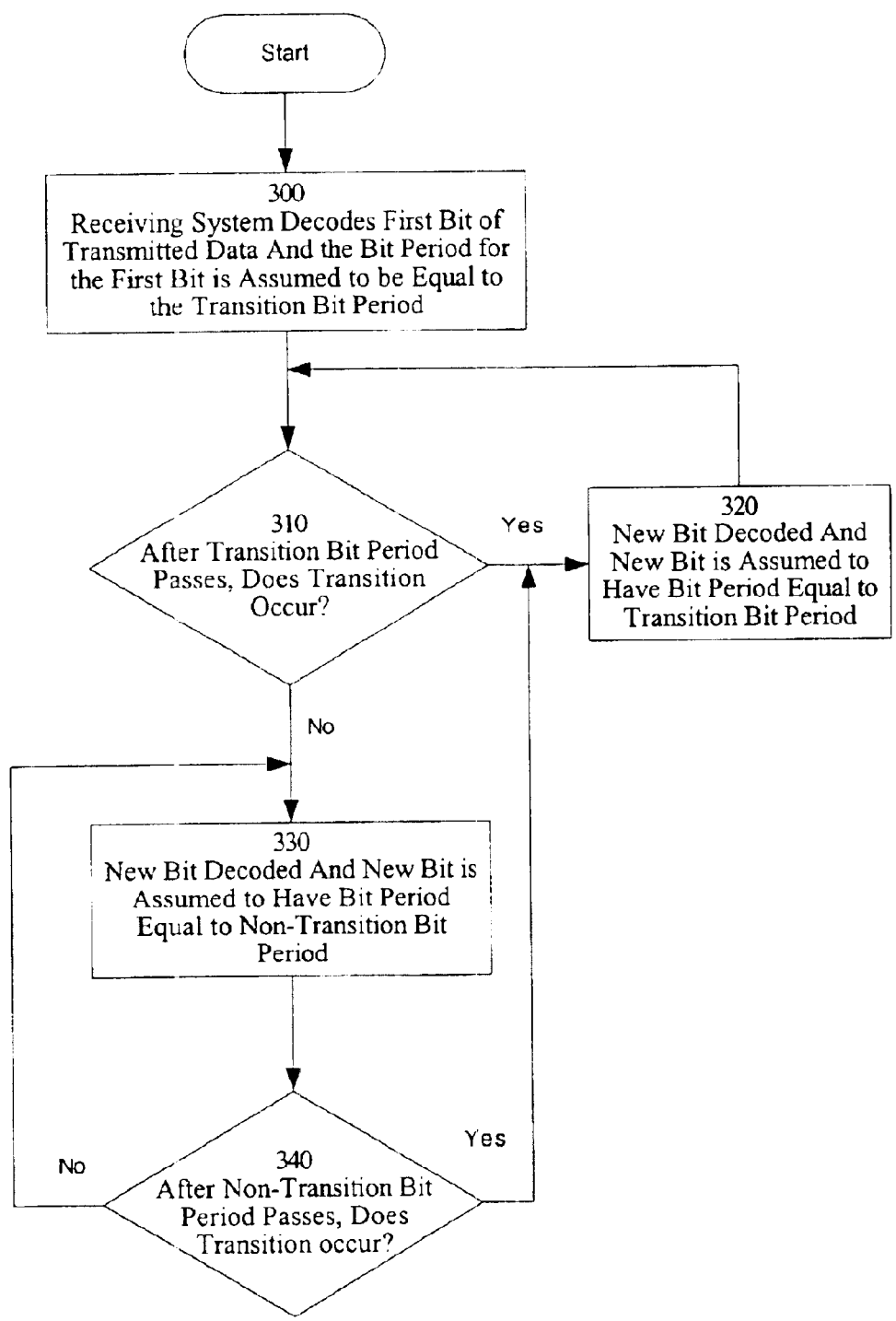
FIG. 3A is a flow diagram of the process of decompressing a modulated carrier signal wherein each bit is decoded as it is encountered in accordance with one embodiment of the present invention.

FIG. 3A illustrates the process of decompressing a modulated carrier signal wherein each bit is decoded as it is encountered in accordance with one embodiment of the present invention. At block 300, the receiving system decodes the first bit of the transmitted data and the bit period for the first bit is assumed to be equal to the transition bit period. At block 310, after the transition bit period passes, it is determined whether a transition occurs.

Any of many well-known methods for detecting a signal transition may be used in various embodiments of the present invention. In one embodiment, a range of the signal around the location where the transition should occur is checked for the presence of a transition. However, the range checked is not larger than the non-transition bit period for the transmission. If a transition occurs, at block 320, a new bit is decoded (the opposite of the previous bit) and the new bit is assumed to have a bit period equal to the transition bit period and the process repeats at block 310.

If a transition does not occur, at block 330, a new bit is decoded (the same as the previous bit) and the new bit is assumed to have a bit period equal to the non-transition bit period. At block 340, after the non-transition bit period passes, it is determined whether a transition occurs. If a transition occurs, the process repeats at block 320. If a transition does not occur, the process repeats at block 330.

Figure 3B:
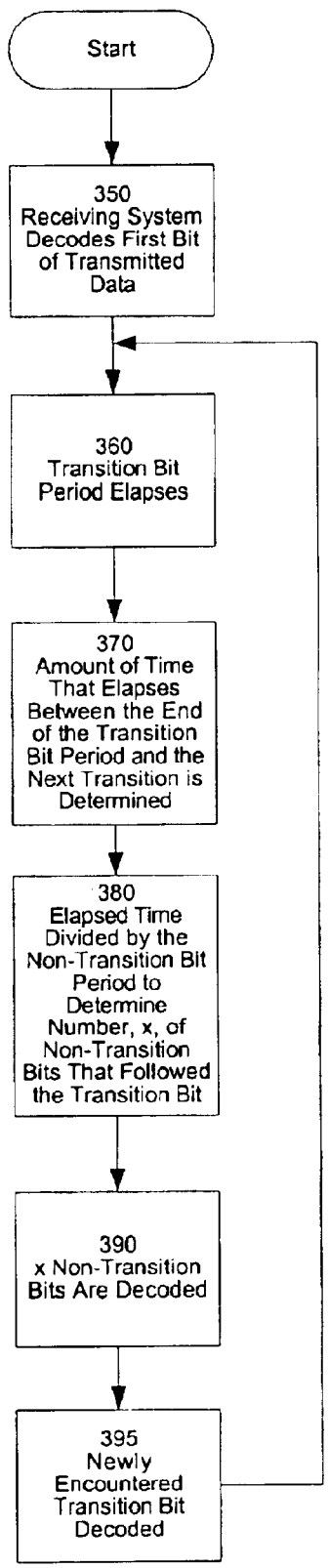
FIG. 3B is a flow diagram of the process of decompressing a modulated carrier signal wherein bits are decoded as transitions are encountered in accordance with one embodiment of the present invention.

FIG. 3B illustrates the process of decompressing a modulated carrier signal wherein bits are decoded as transitions are encountered in accordance with one embodiment of the present invention. At block 350, the receiving system decodes the first bit of the transmitted data. At block 360, the transition bit period elapses. At block 370, the amount of time that elapses between the end of the transition bit period and the next transition is determined.

At block 380, the elapsed time is divided by the non-transition bit period to determine the number, x, of non-transition bits that followed the transition bit. If no time elapses between the end of the previous transition bit period and the new transition, the number of non-transition bits is equal to zero. At block 390, x non-transition bits are decoded. At block 395, the newly encountered transition bit is decoded and the process repeats at block 360.

In other embodiments, the above schemes are used to decompress binary data regardless of whether the binary data is being transmitted. For example, various embodiments use one or the other of the above schemes to decompress binary data that is stored on a magnetic tape.

Example Sequence

Figure 4:
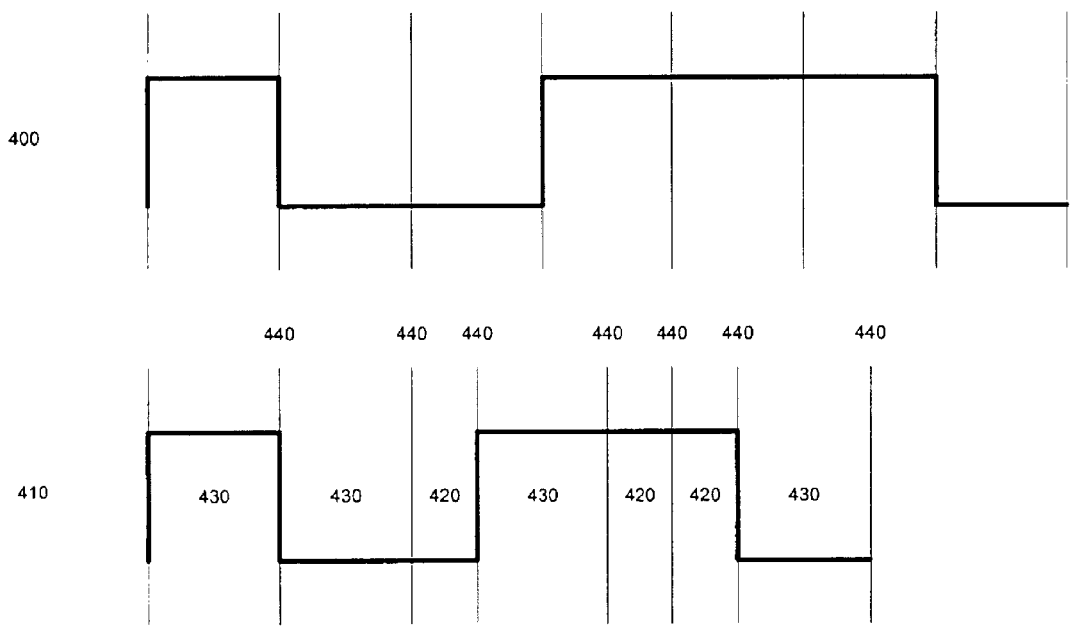
FIG. 4 is a block diagram of an example of a modulated sequence, its compressed representation and its decompressed representation in accordance with one embodiment of the present invention.

FIG. 4 illustrates an example of a modulated sequence, its compressed representation and its decompressed representation in accordance with one embodiment of the present invention. The sequence 1001110 is represented in modulated carrier signal 400. Modulated carrier signal 400 is not compressed, so each bit has the same bit period and it will take 7 bit periods to transmit this sequence.

When modulated carrier signal 400 is compressed using one embodiment of the present invention, compressed signal 410 results. In compressed signal 410, non-transition bits 420 have half the bit period of transition bits 430. Thus, it will only take 5.5 transition bit periods to transmit the sequence instead of 7.

As the receiving system encounters compressed signal 410, it checks for transitions one transition bit period after the first and all transition bits and one non-transition bit period after all non-transition bits. Thus, the receiving system will check for transitions at locations 440 in compressed signal 410. If there is no transition at locations 440, the receiving system decodes the next bit as a non-transition bit. If there is a transition at locations 440, the receiving system decodes the next bit as a transition bit, thus generating decompressed sequence 1001110.

Header Sequence

In one embodiment, a header sequence is transmitted. In one embodiment, the header sequence is known to the receiving system. Thus, the header sequence is used to synchronize the receiving system. In one embodiment, the header sequence contains a series of transition bits (e.g., 1010 or 0101) to assist in synchronization. Since the receiving system is expecting the series of transition bits, it is able to determine the timing of modulated carrier signal as well as the duration of the transition bit period.

Figure 5A:
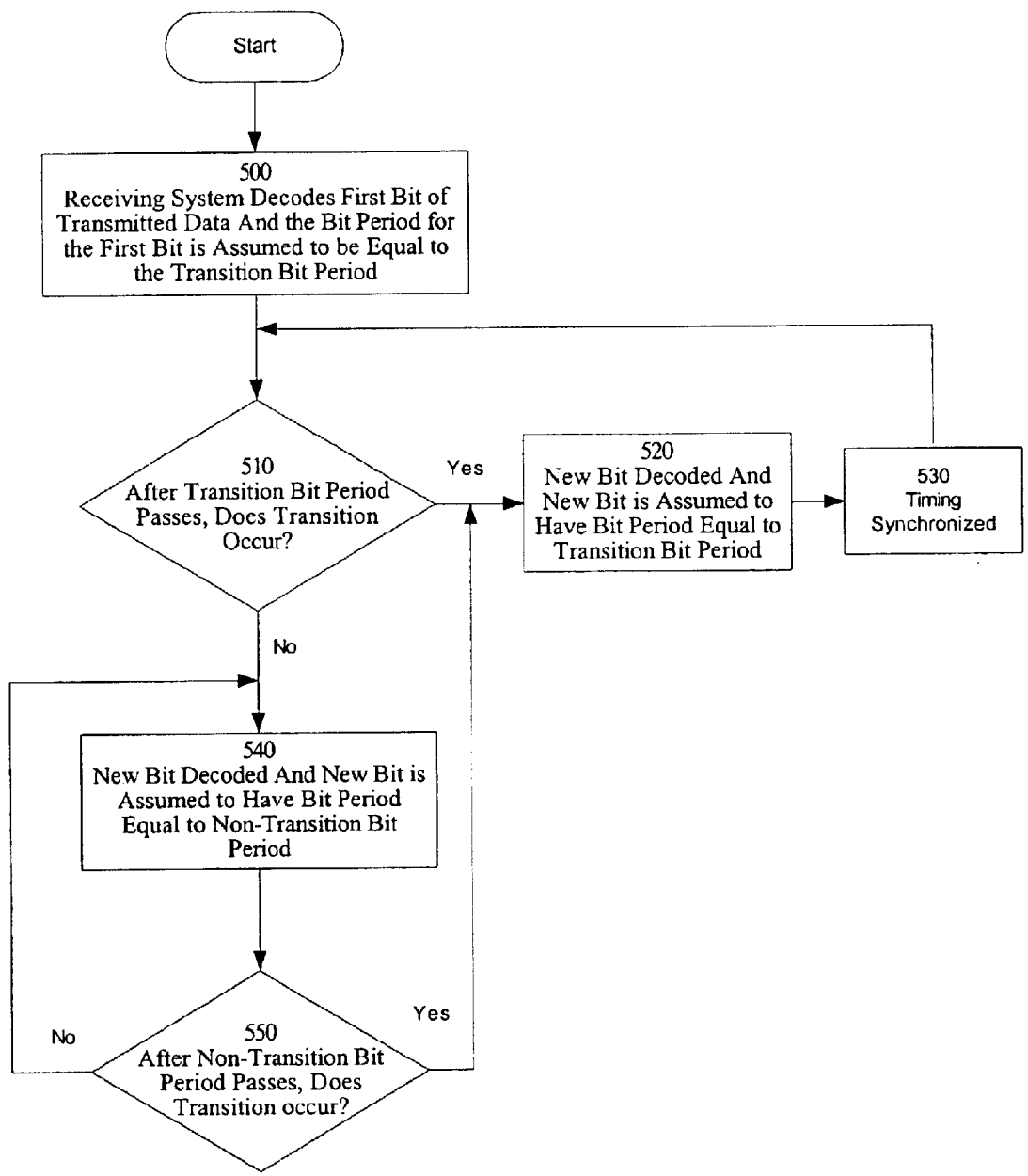
FIG. 5A is a flow diagram of the process of receiving a compressed modulated carrier signal wherein each bit is decoded as it is encountered in accordance with one embodiment of the present invention.

In another embodiment, every time a transition bit is received, synchronization is performed. FIG. 5A illustrates the process of receiving a compressed modulated carrier signal wherein each bit is decoded as it is encountered in accordance with one embodiment of the present invention. At block 500, the receiving system decodes the first bit of the transmitted data and the bit period for the first bit is assumed to be equal to the transition bit period. At block 510, after the transition bit period passes, it is determined whether a transition occurs. If a transition occurs, at block 520, a new bit is decoded (the opposite of the previous bit) and the new bit is assumed to have a bit period equal to the transition bit period. At block 530, the timing is resynchronized and the process repeats at block 510.

If a transition does not occur, at block 540, a new bit is decoded (the same as the previous bit) and the new bit is assumed to have a bit period equal to the non-transition bit period. At block 550, after the non-transition bit period passes, it is determined whether a transition occurs. If a transition occurs, the process repeats at block 520. If a transition does not occur, the process repeats at block 540.

Figure 5B:
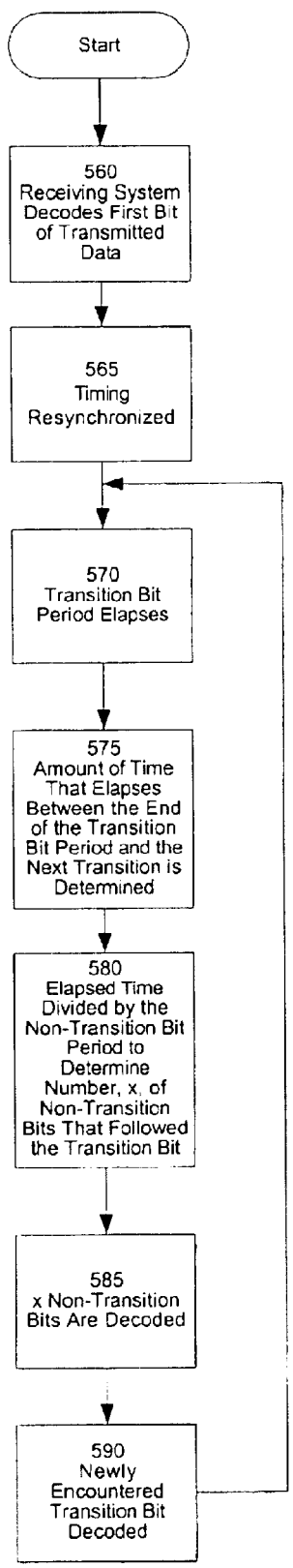
FIG. 5B is a flow diagram of the process of receiving a compressed modulated carrier signal wherein bits are decoded as transitions are encountered in accordance with one embodiment of the present invention.

FIG. 5B illustrates the process of receiving a compressed modulated carrier signal wherein bits are decoded as transitions are encountered in accordance with one embodiment of the present invention. At block 560, the receiving system decodes the first bit of the transmitted data. At block 565, the timing is resynchronized. At block 570, the transition bit period elapses. At block 575, the amount of time that elapses between the end of the transition bit period and the next transition is determined.

At block 580, the elapsed time is divided by the non-transition bit period to determine the number, x, of non-transition bits that followed the transition bit. If no time elapses between the end of the previous transition bit period and the new transition, the number of non-transition bits is equal to zero. At block 585, x non-transition bits are decoded. At block 590, the newly encountered transition bit is decoded and the process repeats at block 565.

In yet another embodiment, the header contains a non-transition bit (e.g., 10100 or 01011). Because the receiving system knows where the non-transition bit occurs, the system is able to determine the bit period of non-transition bits. Thus, the system is capable of receiving different transitions that each have a different bit period for non-transition bits (e.g., one with a bit period equal to one-half the length of the bit period for transition bits, and another with a bit period equal to one-fifth the length of the bit period for transition bits).

Figure 6:
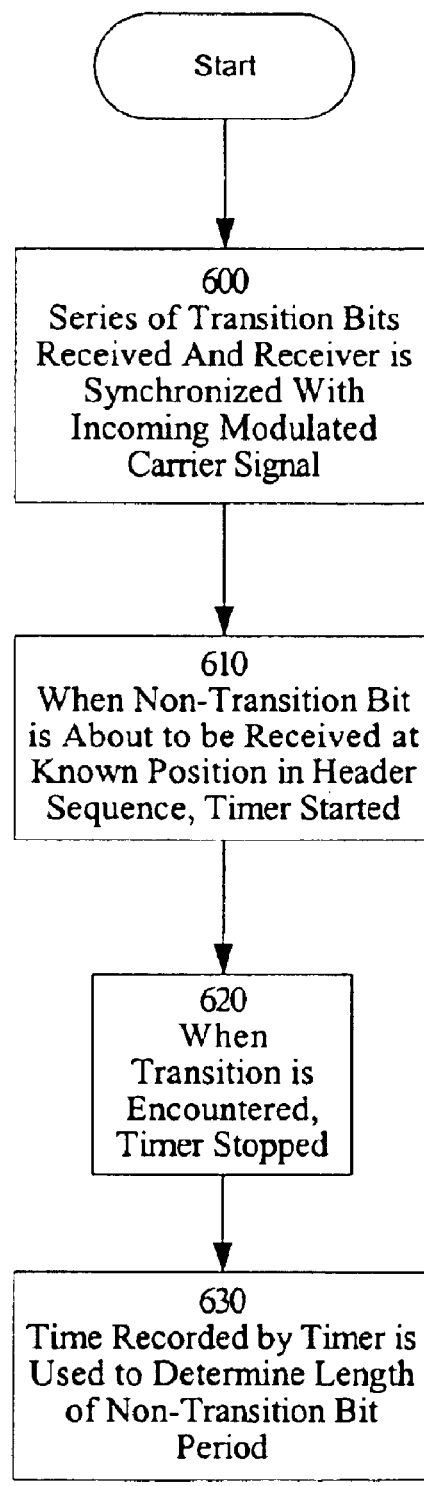
FIG. 6 is a flow diagram of the process of determining the non-transition bit period in accordance with one embodiment of the present invention.

FIG. 6 illustrates the process of determining the non-transition bit period in accordance with one embodiment of the present invention. At block 600, a series of transition bits is received and the receiver is synchronized with the incoming modulated carrier signal. At block 610, when a non-transition bit is about to be received at a known position in the header sequence, a timer is started. At block 620, when a transition is encountered, the timer is stopped. At block 630, the time recorded by the timer is used to determine the length of the non-transition bit period.

In one embodiment, only one non-transition bit is transmitted when the timer is running. In this embodiment, the time recorded by the timer is the non-transition bit period. In another embodiment, more than one non-transition bits are transmitted when the timer is running. In this embodiment, the non-transition bit period is calculated by dividing the recorded time by the number of non-transition bits. In still other embodiments, the timer is started when the last transition bit before the non-transition bit is received. In these embodiments, the transition bit period is subtracted from the recorded time as part of calculating the non-transition bit period. Other embodiments start and stop the timer at different times and appropriately adjust their calculation of the non-transition bit period.

Although described in connection with transmitted data, the invention described in this patent application is applicable to the transport or storage of any type of binary data, regardless of the medium (i.e., wireless, wired, magnetic, optical, etc.). This invention increases the transfer speed and/or storage capacity of any binary data transport or storage system by compressing in time (and/or storage space) all portions of the binary data which contain non-changing logic states.

Noise Immunity

In another embodiment, noise in compressed binary data is masked using bit period information. When a transition bit is encountered during decompression, no other transition can be valid until at least the transition bit period has passed. Thus, noise occurring before passage of the transition bit period will not result in an error. This noise immunity property increases as the percentage of transition bits in the data increases.

Figure 7:
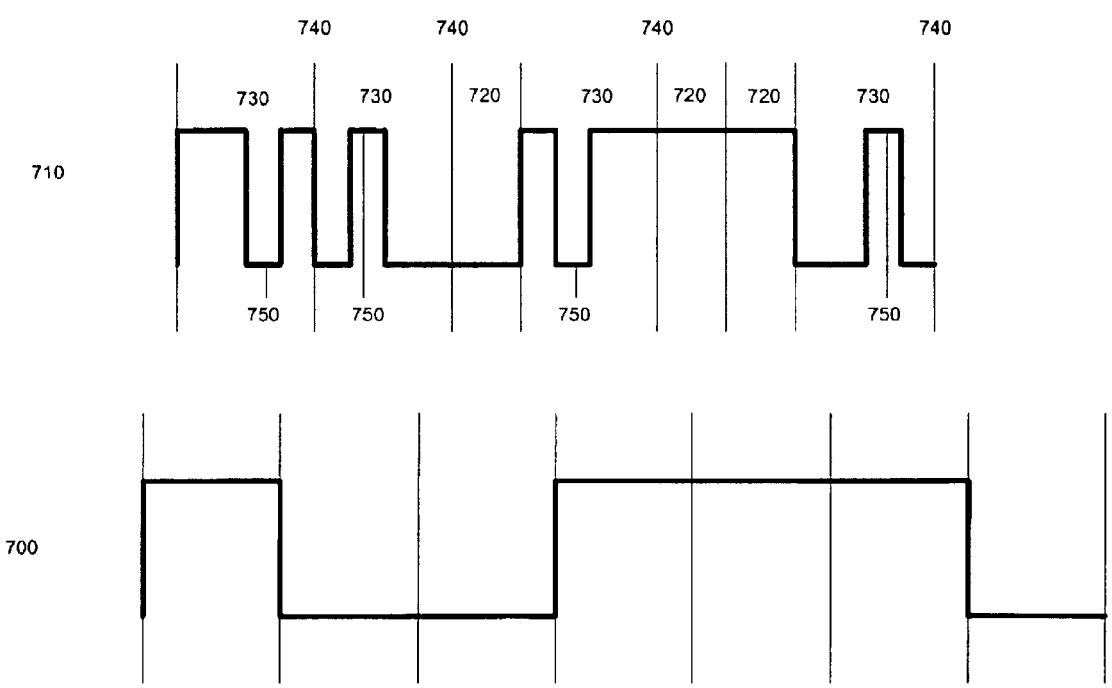
FIG. 7 is a block diagram of a noisy compressed signal and the resulting decompressed signal in accordance with one embodiment of the present invention.

FIG. 7 illustrates a noisy compressed signal and the resulting decompressed signal in accordance with one embodiment of the present invention. When noisy, compressed signal 710 is decompressed using one embodiment of the present invention, decompressed signal 700 results. In noisy, compressed signal 710, non-transition bits 720 have half the bit period of transition bits 730. After encountering a transition, the system does not look for another transition until points 740. Noise 750 does not cause errors because the noise occurs within the transition bit period 730 where the system knows the noise cannot be valid transitions. Thus, embodiments of the present invention are partly immune from the adverse effects of noise.

Embodiment of Computer Execution Environment (Hardware)

Figure 8:
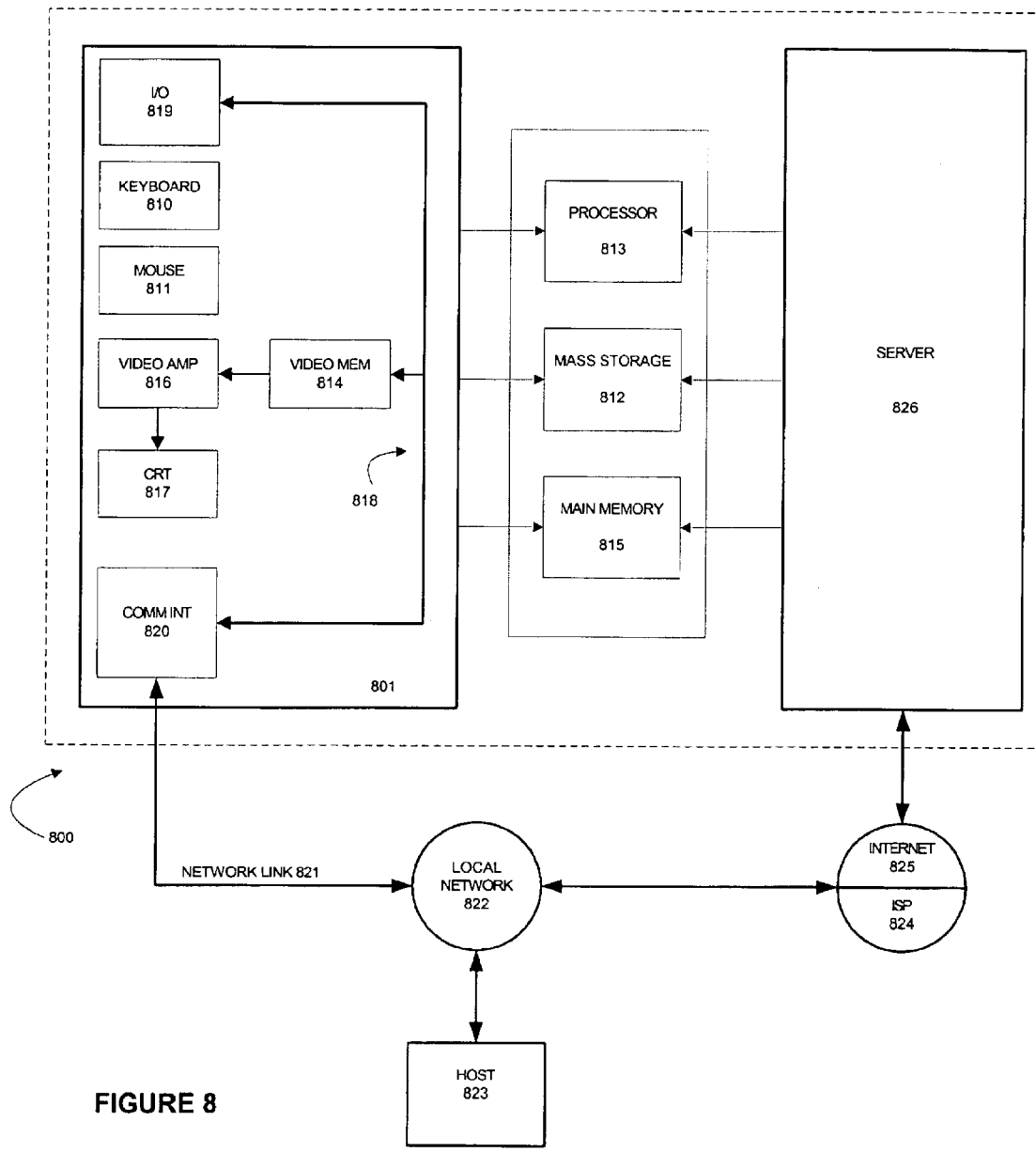
FIG. 8 is a block diagram of a general purpose computer.

An embodiment of the invention can be implemented as computer software in the form of computer readable program code executed in a general purpose computing environment such as environment 800 illustrated in FIG. 8, or in the form of bytecode class files executable within a Java™ run time environment running in such an environment, or in the form of bytecodes running on a processor (or devices enabled to process bytecodes) existing in a distributed environment (e.g., one or more processors on a network). A keyboard 810 and mouse 811 are coupled to a system bus 818. The keyboard and mouse are for introducing user input to the computer system and communicating that user input to central processing unit (CPU) 813. Other suitable input devices may be used in addition to, or in place of, the mouse 811 and keyboard 810. I/O (input/output) unit 819 coupled to bi-directional system bus 818 represents such I/O elements as a printer, A/V (audio/video) I/O, etc.

Computer 801 may include a communication interface 820 coupled to bus 818. Communication interface 820 provides a two-way data communication coupling via a network link 821 to a local network 822. For example, if communication interface 820 is an integrated services digital network (ISDN) card or a modem, communication interface 820 provides a data communication connection to the corresponding type of telephone line, which comprises part of network link 821. If communication interface 820 is a local area network (LAN) card, communication interface 820 provides a data communication connection via network link 821 to a compatible LAN. Wireless links are also possible. In any such implementation, communication interface 820 sends and receives electrical, electromagnetic or optical signals which carry digital data streams representing various types of information.

Network link 821 typically provides data communication through one or more networks to other data devices. For example, network link 821 may provide a connection through local network 822 to local server computer 823 or to data equipment operated by ISP 824. ISP 824 in turn provides data communication services through the world wide packet data communication network now commonly referred to as the "Internet" 825. Local network 822 and Internet 825 both use electrical, electromagnetic or optical signals which carry digital data streams. The signals through the various networks and the signals on network link 821 and through communication interface 820, which carry the digital data to and from computer 800, are exemplary forms of carrier waves transporting the information.

Processor 813 may reside wholly on client computer 801 or wholly on server 826 or processor 813 may have its computational power distributed between computer 801 and server 826. Server 826 symbolically is represented in FIG. 8 as one unit, but server 826 can also be distributed between multiple "tiers". In one embodiment, server 826 comprises a middle and back tier where application logic executes in the middle tier and persistent data is obtained in the back tier. In the case where processor 813 resides wholly on server 826, the results of the computations performed by processor 813 are transmitted to computer 801 via Internet 825, Internet Service Provider (ISP) 824, local network 822 and communication interface 820. In this way, computer 801 is able to display the results of the computation to a user in the form of output.

Computer 801 includes a video memory 814, main memory 815 and mass storage 812, all coupled to bi-directional system bus 818 along with keyboard 810, mouse 811 and processor 813. As with processor 813, in various computing environments, main memory 815 and mass storage 812, can reside wholly on server 826 or computer 801, or they may be distributed between the two. Examples of systems where processor 813, main memory 815, and mass storage 812 are distributed between computer 801 and server 826 include the thin-client computing architecture developed by Sun Microsystems, Inc., the palm pilot computing device and other personal digital assistants, Internet ready cellular phones and other Internet computing devices, and in platform independent computing environments, such as those which utilize the Java technologies also developed by Sun Microsystems, Inc.

The mass storage 812 may include both fixed and removable media, such as magnetic, optical or magnetic optical storage systems or any other available mass storage technology. Bus 818 may contain, for example, thirty-two address lines for addressing video memory 814 or main memory 815. The system bus 818 also includes, for example, a 32-bit data bus for transferring data between and among the components, such as processor 813, main memory 815, video memory 814 and mass storage 812. Alternatively, multiplex data/address lines may be used instead of separate data and address lines.

In one embodiment of the invention, the processor 813 is a SPARC microprocessor from Sun Microsystems, Inc., a microprocessor manufactured by Motorola, such as the 680X0 processor, or a microprocessor manufactured by Intel, such as the 80X86 or Pentium processor. However, any other suitable microprocessor or microcomputer may be utilized. Main memory 815 is comprised of dynamic random access memory (DRAM). Video memory 814 is a dual-ported video random access memory. One port of the video memory 814 is coupled to video amplifier 816. The video amplifier 816 is used to drive the cathode ray tube (CRT) raster monitor 817. Video amplifier 816 is well known in the art and may be implemented by any suitable apparatus. This circuitry converts pixel data stored in video memory 814 to a raster signal suitable for use by monitor 817. Monitor 817 is a type of monitor suitable for displaying graphic images.

Computer 801 can send messages and receive data, including program code, through the network(s), network link 821, and communication interface 820. In the Internet example, remote server computer 826 might transmit a requested code for an application program through Internet 825, ISP 824, local network 822 and communication interface 820. The received code may be executed by processor 813 as it is received, and/or stored in mass storage 812, or other non-volatile storage for later execution. In this manner, computer 800 may obtain application code in the form of a carrier wave. Alternatively, remote server computer 826 may execute applications using processor 813, and utilize mass storage 812, and/or video memory 815. The results of the execution at server 826 are then transmitted through Internet 825, ISP 824, local network 822 and communication interface 820. In this example, computer 801 performs only input and output functions.

Application code may be embodied in any form of computer program product. A computer program product comprises a medium configured to store or transport computer readable code, or in which computer readable code may be embedded. Some examples of computer program products are CD-ROM disks, ROM cards, floppy disks, magnetic tapes, computer hard drives, servers on a network, and carrier waves.

The computer systems described above are for purposes of example only. An embodiment of the invention may be implemented in any type of computer system or programming or processing environment.

Thus, a method and apparatus for compression of modulated data transmission is described in conjunction with one or more specific embodiments. The invention is defined by the following claims and their full scope and equivalents.

What is claimed is:

1. A method of data transmission comprising:
   transmitting a plurality of transition bits wherein each of said plurality of transition bits is transmitted with a first bit period; and
   transmitting a plurality of non-transition bits wherein each of said plurality of non-transition bits is transmitted with a second bit period, wherein said second bit period is smaller than said first bit period.

2. The method of claim 1 wherein a ratio between said second bit period and said first bit period is one-half.

3. The method of claim 1 wherein a ratio between said second bit period and said first bit period is one-third.

4. The method of claim 1 wherein a ratio between said second bit period and said first bit period is one-fourth.

5. The method of claim 1 wherein a ratio between said second bit period and said first bit period is one-fifth.

6. The method of claim 1 wherein said second bit period is as small as is possible without corrupting or losing said data item.

7. The method of claim 1 wherein said step of compressing further comprises:
   transmitting a header sequence wherein said header sequence is known to a receiver system.

8. The method of claim 7 wherein said header sequence contains a series of transition bits wherein said series of transition bits is used to synchronize said receiver system.

9. The method of claim 7 wherein said header sequence contains a series of transition bits wherein said series of transition bits is used to determine said first bit period at said receiver system.

10. The method of claim 7 wherein said header sequence contains a non-transition bit wherein said non-transition bit is used to determine said second bit period at said receiver system.

11. The method of claim 1 further comprising:
    synchronizing a receiver system whenever one of said plurality of transition bits is received at said receiver system.

12. A method of data compression comprising:
    obtaining a representation of a data item in a binary code; and
    compressing said representation wherein said step of compressing comprises:
       determining a plurality of transition bits wherein each of said plurality of transition bits is associated with a first bit period; and
       determining a plurality of non-transition bits wherein each of said plurality of non-transition bits is associated with a second bit period, wherein said second bit period is smaller than said first bit period.

13. The method of claim 12 wherein a ratio between said second bit period and said first bit period is one-half.

14. The method of claim 12 wherein a ratio between said second bit period and said first bit period is one-third.

15. The method of claim 12 wherein a ratio between said second bit period and said first bit period is one-fourth.

16. The method of claim 12 wherein a ratio between said second bit period and said first bit period is one-fifth.

17. The method of claim 12 wherein said second bit period is as small as is possible without corrupting or losing said data item.

18. A data transmission system comprising:
    a carrier signal; and
    a transmission unit configured to transmit a plurality of transition bits wherein each of said plurality of transition bits is transmitted with a first bit period, wherein said transmission unit is further configured to transmit a plurality of non-transition bits wherein each of said plurality of non-transition bits is transmitted with a second bit period, wherein said second bit period is smaller than said first bit period.

19. The data transmission system of claim 18 wherein a ratio between said second bit period and said first bit period is one-half.

20. The data transmission system of claim 18 wherein a ratio between said second bit period and said first bit period is one-third.

21. The data transmission system of claim 18 wherein a ratio between said second bit period and said first bit period is one-fourth.

22. The data transmission system of claim 18 wherein a ratio between said second bit period and said first bit period is one-fifth.

23. The data transmission system of claim 18 wherein said second bit period is as small as is possible without corrupting or losing said data item.

24. The data transmission system of claim 18 wherein said compression unit further comprises:
a header generator configured to generate a header sequence wherein said header sequence is known to a receiver system.

25. The data transmission system of claim 24 wherein said header sequence contains a series of transition bits wherein said series of transition bits is used to synchronize said receiver system.

26. The data transmission system of claim 24 wherein said header sequence contains a series of transition bits wherein said series of transition bits is used to determine said first bit period at said receiver system.

27. The data transmission system of claim 24 wherein said header sequence contains a non-transition bit wherein said non-transition bit is used to determine said second bit period at said receiver system.

28. The data transmission system of claim 18 further comprising:
a synchronizing unit configured to synchronize a receiver system whenever one of said plurality of transition bits is received at said receiver system.

29. A data compression system comprising:
a binary encoder configured to encode a representation of a data item in a binary code;
a first determiner configured to determine a plurality of transition bits wherein each of said plurality of transition bits is associated with a first bit period; and
a second determiner configured to determine a plurality of non-transition bits wherein each of said plurality of non-transition bits is associated with a second bit period, wherein said second bit period is smaller than said first bit period.

30. The data compression system of claim 29 wherein a ratio between said second bit period and said first bit period is one-half.

31. The data compression system of claim 29 wherein a ratio between said second bit period and said first bit period is one-third.

32. The data compression system of claim 29 wherein a ratio between said second bit period and said first bit period is one-fourth.

33. The data compression system of claim 29 wherein a ratio between said second bit period and said first bit period is one-fifth.

34. The data compression system of claim 29 wherein said second bit period is as small as is possible without corrupting or losing said data item.

35. A data transmission system comprising:
a carrier signal; and
a decompression unit configured to decompress said data, wherein said unit further comprises:
a first decoding unit to decode a first bit of said data;
a first checking unit to check for a first transition bit after a transition bit period passes;
a second decoding unit to decode a second bit of said data; and
a second checking unit to check for a second transition bit after a non-transition bit period passes.

36. The system of claim 35 wherein said first decoding unit and said second decoding unit is a same unit.

37. The system of claim 35 wherein said first checking unit and said second checking unit is a same unit.

38. The system of claim 35 wherein said first checking unit to check for a first transition bit further comprises:
a detection unit to detect an amount of time that elapses between end of said transmission bit period and a next transition;
a dividing unit to divide said time by said non-transition bit period to determine one or more non-transition bits that follows said first transition bit;
a third decoding unit to decode said one or more non-transition bits; and
a fourth decoding unit to decode said second transition bit.

39. The system of claim 38 wherein said third decoding unit and said fourth decoding unit is a same unit.

40. A method of data transmission comprising:
decompressing said data, wherein said step of decompressing further comprises:
decoding a first bit of said data;
checking for a first transition bit after a transition bit period passes;
decoding a second bit of said data; and
checking for a second transition bit after a non-transition bit period passes.

41. The method of claim 40 wherein said step of checking for a first transition bit further comprises:
detecting an amount of time that elapses between end of said transmission bit period and a next transition;
dividing said time by said non-transition bit period to determine one or more non-transition bits that follows said first transition bit;
decoding said one or more non-transition bits; and
decoding said second transition bit.

42. A computer program product comprising:
a computer usable medium having computer readable program code embodied therein configured for data transmission, comprising:
computer readable code configured to cause a computer to decompress said data, wherein said computer readable code to cause said computer to decompress further comprises:
computer readable code configured to cause a computer to decode a first bit of said data;
computer readable code configured to cause a computer to check for a first transition bit after a transition bit period passes;
computer readable code configured to cause a computer to decode a second bit of said data; and
computer readable code configured to cause a computer to check for a second transition bit after a non-transition bit period passes.

43. The computer program product of claim 42 wherein said check for a first transition bit further comprises:
a computer readable code configured to cause a computer to detect an amount of time that elapses between end of said transmission bit period and a next transition;
a computer readable code configured to cause a computer to divide said time by said non-transition bit period to determine one or more non-transition bits that follows said first transition bit;

a computer readable code configured to cause a computer to decode said one or more non-transition bits; and a computer readable code configured to cause a computer to decode said second transition bit.

44. A computer program product comprising:

a computer usable medium having computer readable program code embodied therein configured for compressing binary data, comprising:

computer readable code configured to cause a computer to encode a representation of a data item in a binary code;

computer readable code configured to cause a computer to determine a plurality of transition bits wherein each of said plurality of transition bits is associated with a first bit period; and computer readable code configured to cause a computer to determine a plurality of non-transition bits wherein each of said plurality of non-transition bits is associated with a second bit period, wherein said second bit period is smaller than said first bit period.

45. The computer program product of claim 44 wherein a ratio between said second bit period and said first bit period is one-half.

46. The computer program product of claim 44 wherein a ratio between said second bit period and said first bit period is one-third.

47. The computer program product of claim 44 wherein a ratio between said second bit period and said first bit period is one-fourth.

48. The computer program product of claim 44 wherein a ratio between said second bit period and said first bit period is one-fifth.

49. The computer program product of claim 44 wherein said second bit period is as small as is possible without corrupting or losing said data item.

50. A computer program product comprising:

a computer usable medium having computer readable program code embodied therein configured for data transmission, comprising:

computer readable code configured to cause a computer to transmit a plurality of transition bits wherein each of said plurality of transition bits is transmitted with a first bit period; and computer readable code configured to cause a computer to transmit a plurality of non-transition bits wherein each of said plurality of non-transition bits is transmitted with a second bit period, wherein said second bit period is smaller than said first bit period.

51. The computer program product of claim 50 wherein a ratio between said second bit period and said first bit period is one-half.

52. The computer program product of claim 50 wherein a ratio between said second bit period and said first bit period is one-third.

53. The computer program product of claim 50 wherein a ratio between said second bit period and said first bit period is one-fourth.

54. The computer program product of claim 50 wherein a ratio between said second bit period and said first bit period is one-fifth.

55. The computer program product of claim 50 wherein said second bit period is as small as is possible without corrupting or losing said data item.

56. The computer program product of claim 50 wherein said compression unit further comprises:

computer readable code configured to cause a computer to generate a header sequence wherein said header sequence is known to a receiver system.

57. The computer program product of claim 56 wherein said header sequence contains a series of transition bits wherein said series of transition bits is used to synchronize said receiver system.

58. The computer program product of claim 56 wherein said header sequence contains a series of transition bits wherein said series of transition bits is used to determine said first bit period at said receiver system.

59. The computer program product of claim 56 wherein said header sequence contains a non-transition bit wherein said non-transition bit is used to determine said second bit period at said receiver system.

60. The computer program product of claim 50 further comprising:

computer readable code configured to cause a computer to synchronize a receiver system whenever one of said plurality of transition bits is received at said receiver system.

* * * * *